United States Patent
Ramaswami (10) Patent No.: US 10,608,039 B1
(45) Date of Patent: Mar. 31, 2020

(54) IMAGING ARRAYS HAVING FOCAL PLANE PHASE DETECTING PIXEL SENSORS

(71) Applicant: Foveon, Inc., San Jose, CA (US)

(72) Inventor: Shrinath Ramaswami, San Jose, CA (US)

(73) Assignee: Foveon, Inc., San Jose, CA (US)

( * ) Notice: Subject to any disclaimer, the term of this patent is extended or adjusted under 35 U.S.C. 154(b) by 0 days.

(21) Appl. No.: 16/150,215

(22) Filed: Oct. 2, 2018

(51) Int. Cl.
*H01L 31/0232* (2014.01)
*H01L 27/146* (2006.01)

(52) U.S. Cl.
CPC .. *H01L 27/14647* (2013.01); *H01L 27/14605* (2013.01); *H01L 27/14627* (2013.01); *H01L 27/14629* (2013.01); *H01L 27/14636* (2013.01)

(58) Field of Classification Search
CPC ............ H01L 27/146; H01L 27/14647; H01L 27/14605; H01L 27/14627; H01L 27/14636
See application file for complete search history.

(56) References Cited

U.S. PATENT DOCUMENTS

| | | | | |
|---|---|---|---|---|
| 6,487,148 | B1* | 11/2002 | Hsieh | B82Y 10/00 369/47.1 |
| 2007/0031988 | A1* | 2/2007 | Agranov | H01L 27/1462 438/60 |
| 2015/0372034 | A1* | 12/2015 | Chen | H01L 27/14614 257/292 |
| 2018/0276519 | A1* | 9/2018 | Benkley, III | G06K 9/0002 |

OTHER PUBLICATIONS

"Image Sensors for Mobile Use: SmartFSI®," https://industrial.panasonic.com/ww/products/semiconductors/imagesensors/mobile, date unavailable.
Tzu-Hsuan, et al., "High-Efficiency Dielectric Structure for Advanced CMOS Imagers", VLSI Technology Laboratory, Institute of Microelectronics, Department of Electrical Engineering, National Cheng Kung University, Tainan, Taiwan, R.O.C., date unknown.

\* cited by examiner

*Primary Examiner* — Phuc T Dang
(74) *Attorney, Agent, or Firm* — Glass and Associates; Kenneth D'Alessandro; Kenneth Glass (57) ABSTRACT

A focal plane phase detect pixel sensor is formed on a substrate and includes a surface pixel sensor formed in a pixel sensor area at a surface of the substrate. The surface pixel sensor has a sensing area occupying no more than an adjacent pair of quadrants centered in the pixel sensor area. A microlens is disposed over the surface pixel sensor.

38 Claims, 9 Drawing Sheets

IMAGING ARRAYS HAVING FOCAL PLANE PHASE DETECTING PIXEL SENSORS

BACKGROUND

The present relates to imaging array integrated circuits. More particularly, the present invention relates to imaging arrays having focal plane phase detect pixels and methods for performing focal plane phase detection in such arrays.

Imaging arrays having focal plane phase detect (FPPD) pixels are known in the art. FPPD pixels collect light selectively from either left or right side of the camera lens. FPPD pixels are always placed in pairs adjacent to each other. The pairs are distributed over most of the pixel array, typically over about 80 percent of the area around the center of the array, leaving the edges clear. The density of the FPPD pixel pairs is a few percent (1-3) of the pixels within that central area.

Figure 1A:
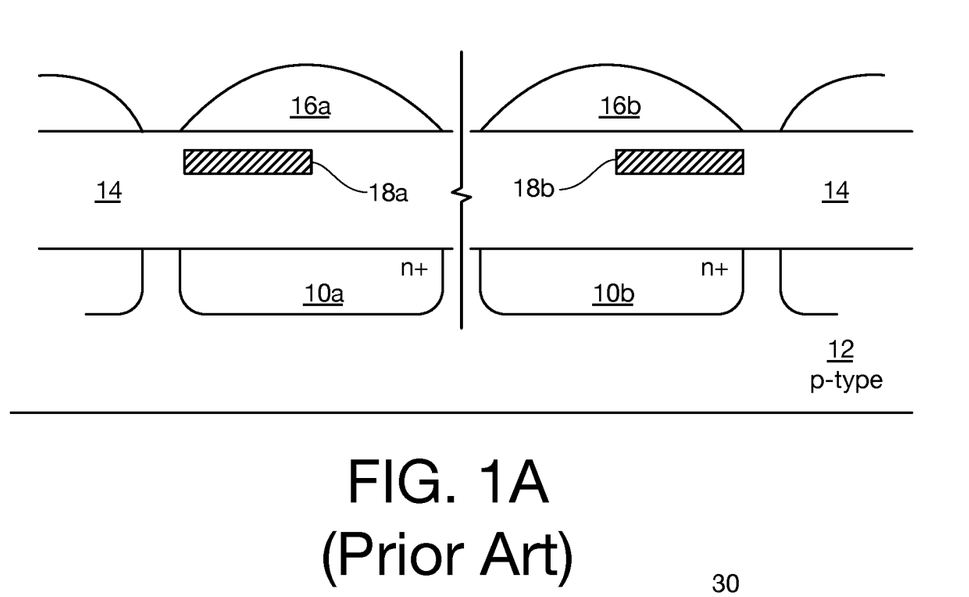
FIG. 1A is a cross-sectional diagram of a portion of an imaging array depicting one prior-art solution for providing FPPD pixels in an imaging array.

The most common method used to implement FPPD pixels in imaging arrays is to employ metal layers disposed in layers above the sensors to shadow selected portions of the FPPD pixels. FIG. 1A shows exemplary prior-art FPPD pixel sensors employing metal layers disposed in layers above the sensors to shadow selected portions of the FPPD pixels. FIG. 1A is a cross-sectional view of a right FPPD pixel sensor 10a and a left FPPD pixel sensor 10b. Pixel sensors 10a and 10b are n-type diffused regions formed in a p-type semiconductor substrate 12 as is known in the art. An interlayer dielectric layer 14 is formed over the surface of the substrate 12 and the pixel sensors 10a and 10b. Microlenses 16a and 16b are formed, respectively, over pixel sensors 10a and 10b. A metal segment 18a is formed and defined over pixel sensor 10a and is positioned to block light from entering on the left side of the pixel sensor 10a. A metal segment 18b is formed and defined over pixel sensor 10b and is positioned to block light from entering on the right side of the pixel sensor 10b.

Figure 1B:
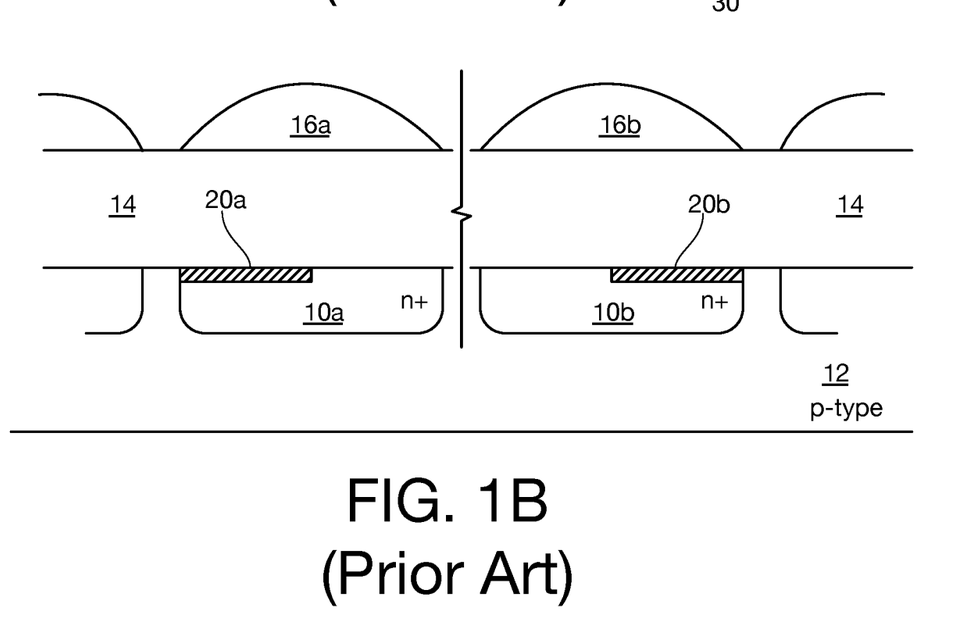
FIG. 1B is a cross-sectional diagram of a portion of an imaging array depicting another prior-art solution for providing FPPD pixels in an imaging array.

Another technique that has been suggested for creating FPPD pixel sensors is to deposit an opaque silicide layer over selected portions of the FPPD pixels. FIG. 1B shows exemplary prior-art FPPD pixel sensors employing an opaque silicide layer over selected portions of the FPPD pixels to shadow selected portions of the FPPD pixels. Many of the features of the pixel sensors are the same in FIGS. 1A and 1B and will be identified using the same reference numerals.

FIG. 1B is a cross-sectional view of a right FPPD pixel sensor 10a and a left FPPD pixel sensor 10b. Pixel sensors 10a and 10b are n-type diffused regions formed in a p-type semiconductor substrate 12 as is known in the art. An interlayer dielectric layer 14 is formed over the surface of the substrate 12 and the pixel sensors 10a and 10b. Microlenses 16a and 16b are formed, respectively, over pixel sensors 10a and 10b. An opaque silicide layer 20a is formed and defined on the surface of the diffused region forming pixel sensor 10a and is positioned to block light from entering on the left side of the pixel sensor 10a. An opaque silicide layer 20b is formed and defined on the surface of the diffused region forming pixel sensor 10b and is positioned to block light from entering on the right side of the pixel sensor 10b. This technique has proved to be unsatisfactory since the silicide layers create significant amounts of leakage current in the FPPD pixels.

As digital cameras become thinner, the angles of light irradiating the individual pixel sensors in the imaging array become larger as measured normal to the surface. Designers have employed several techniques to accommodate these angles.

According to one possible solution, the pixel sensors that make up the array can be increased in size at the cost of decreasing resolution. This is generally not considered to be a satisfactory solution in view of the trend to increase rather than decrease the resolution of digital cameras.

In very small pixel sensors, such as those used for cell-phone camera sensors, a "light pipe" has been employed. This is similar in concept to a fiber optic cable, relying upon total internal reflection (TIR). It therefore requires the use of a high-index polymer as the core of the light pipe. The concept will work well for small incident angles (steep angle of incidence on the sidewall), but it becomes progressively less useful as incident angles increase. According to one particular prior-art light-pipe solution shown in FIG. 2, light pipes employing internal reflection at the edges of lenses are positioned over the pixel sensors. Adjacent pixel sensors 10a and 10b are shown formed in p-type substrate (or well) 12. Dielectric layer 14 is formed over the pixel sensors 10a and 10b. Lenses 16a and 16b are formed on the surface of the dielectric layer as is known in the art.

Figure 2:
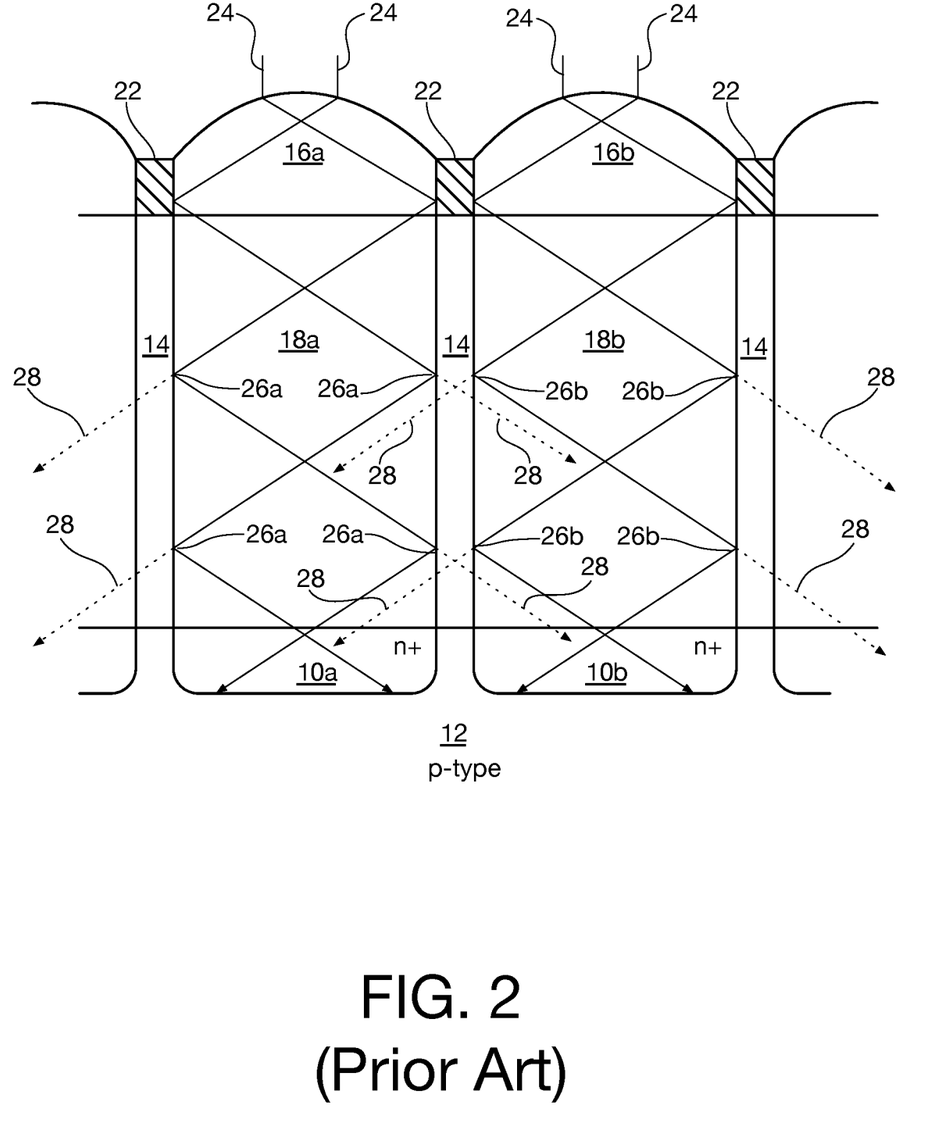
FIG. 2 is a cross sectional diagram of a portion of an imaging array depicting another prior-art solution to the problem of capturing light impinging on the array at increased angles.

Unlike the pixel sensors depicted in FIGS. 1A and 1B, vias are formed in the dielectric layer, respectively over and in alignment with pixel sensors 10a and 10b and are both filled with a polymer to form light pipes (indicated at reference numerals 18a and 18b) having a high index of refraction (e.g., n≅1.6). A layer of material (shown by reference numerals 22) provides total internal reflection is formed at the edges of the lenses 16a and 16b between adjacent pixel areas.

Light rays directed at the surface of the pixel sensor array containing pixel sensors 10a and 10b, two of which are shown symbolically at reference numerals 24. As shown in FIG. 1, the light rays bend at the interface of the lenses 16a and 16b. The light rays 24 are also shown reflecting from the layer 22 at the edges of the lenses. Without the presence of the layers of material 22, these light rays 24 would continue along a path that would lead into the next adjacent pixel but the presence of the layer of reflective material 22 reflects them back into the pixel area into which they entered.

As the light rays 24 continue downward from the lens into the polymer layers 18a and 18b, they are reflected by the interface (shown at reference numerals 26a and 26b) between the respective polymer layers 18a and 18b and the dielectric layer 14 (having an index of refraction of about n=1.53) in which they are formed. This interface is not 100% reflective and so some of the light shown in dashed lines at reference numerals 28 passes through the interface, through the dielectric layer separating the two adjacent pixels, and undesirably into adjacent pixel sensors causing undesirable crosstalk.

Ideally, it would be desirable for a small pixel to have the same acceptance angles as a large pixel without the aforementioned drawbacks of the present solutions. It would also be desirable to provide a light pipe pixel sensor array that both accepts light from relatively large angles and includes FPPD pixels.

BRIEF DESCRIPTION

According to a first aspect of the present invention, a pixel sensor array includes a plurality of surface pixel sensors disposed in a substrate, a layer of dielectric material formed over the surface of the pixel sensors, a plurality of apertures formed in the dielectric layer each aligned with one of the surface pixel sensors and having an inner side wall. A lining layer is formed on the inner side wall of each aperture and is substantially fully reflective to visible light. The lining layer is spaced apart from the surface of the substrate and has a smaller cross-sectional area than a cross-sectional area of each surface pixel sensor. A filler material substantially transparent to visible light is disposed inside of the reflective lining layer and has a top surface lying in the plane with the top surface of the layer of dielectric material. A microlens is disposed over the top surface of each aperture. FPPD pixels created by placement of metal layers are placed in pairs adjacent to each other and are distributed over most of the pixel sensor array.

According to an aspect of the invention the pixel sensing layer is a layer of silicon doped with a dopant species having a first conductivity type, and each surface pixel sensing element is a photodiode formed at the surface of the layer of silicon. Each photodiode has an anode formed from a region of silicon doped with a dopant species having a second conductivity type opposite the first conductivity type.

According to another aspect of the invention the pixel sensor array also includes at least one subsurface pixel sensing element disposed in the pixel sensing layer below, in alignment with, and insulated from the surface pixel sensing element. In one exemplary embodiment, a first subsurface pixel sensing element is disposed in the pixel sensing layer below, in alignment with, and insulated from the surface pixel sensing element, and a second subsurface pixel sensing element is disposed in the pixel sensing layer below, in alignment with, and insulated from the first subsurface pixel sensing element.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description of the present invention is illustrative only and not in any way limiting. Other embodiments of the invention will readily suggest themselves to such skilled persons.

Figure 3A:
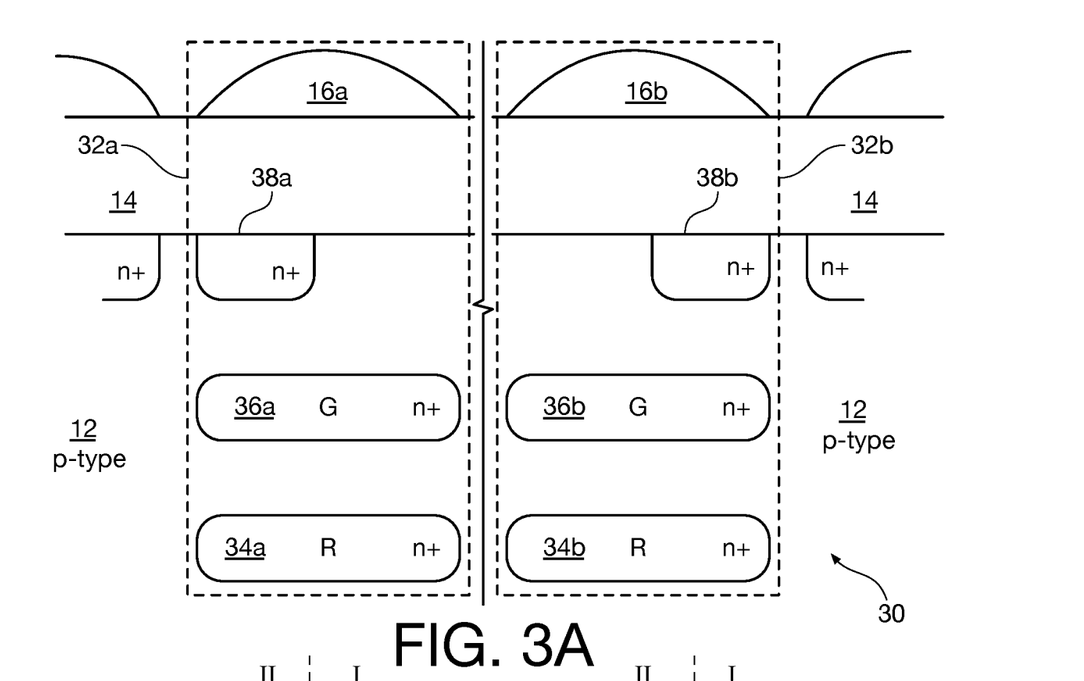
FIG. 3A is a cross sectional diagram of a portion of an imaging array depicting a solution for providing FPPD pixels in an imaging array in accordance with one aspect of the present invention.
Figure 3B:
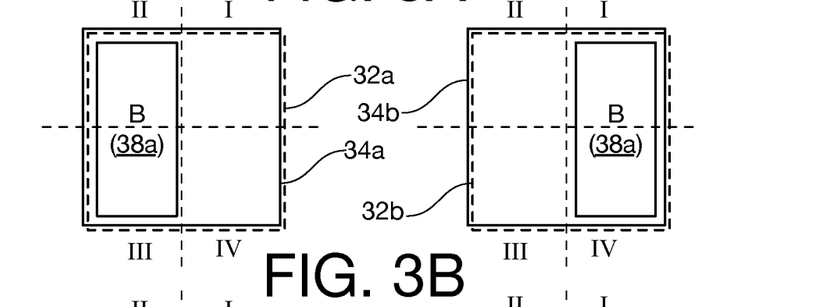
FIGS. 3B and 3C are top views of the portion of the imaging array depicted in FIG. 3A, showing several variations on the FPPD pixel structures.
Figure 3C:
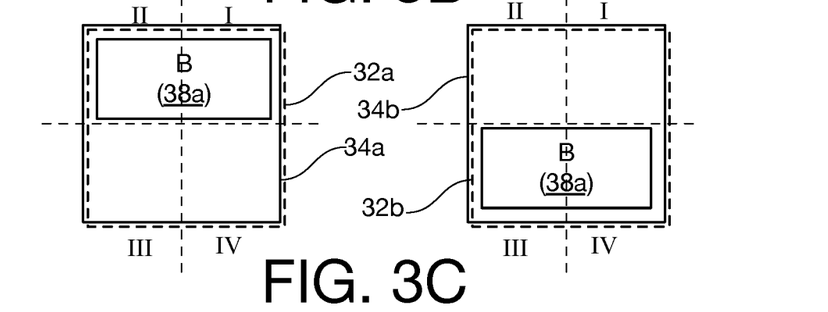

Referring now to FIG. 3A, FIG. 3B and FIG. 3C, a portion 30 of an illustrative array of pixel sensors is depicted. FIG. 3A is a cross sectional view and FIG. 3B and FIG. 3C are top views, respectively, of left/right and top/bottom FPPD pixels 32a and 32b in accordance with one aspect of the present invention. The particular pixel sensors depicted in FIG. 3A, FIG. 3B and FIG. 3C are vertical color pixel sensors of the type manufactured and sold by Foveon, Inc. of San Jose, Calif. The two vertical color pixel sensors shown in FIG. 3A, FIG. 3B and FIG. 3C are both formed in a p-type substrate (or well) 12 and include buried n-type red sensors 34a and 34b, buried n-type green sensors 36a and 36b overlying the red sensors 34a and 34b.

Persons of ordinary skill in the art will appreciate that some vertical color pixel sensors include a single n-type blue surface pixel sensor, and others include blue pixel sensors having multiple segments. An example of a vertical color pixel sensor having blue pixel sensors with multiple segments is found in U.S. Pat. No. 7,339,216, assigned to Foveon, Inc. and includes four n-type blue surface pixel sensors. Persons of ordinary skill in the art will appreciate that each vertical color pixel sensor in the particular embodiment shown in FIG. 3 includes two subsurface (buried) pixel sensors disposed at different depths in the substrate or well, buried n-type red sensors 34a and 34b, and buried n-type green sensors 36a and 36b overlying the buried sensors 34a and 34b, but that other embodiments of the invention are contemplated where vertical color pixel sensors each include a single buried pixel sensor or more than two buried pixel sensors at different depths in the substrate or well.

The pixel sensors 32a and 32b in the embodiment of the present invention depicted in FIG. 3A, FIG. 3B and FIG. 3C takes advantage of the layout for a four-segment blue pixel sensor having sensors smaller in area that the areas of the red and green pixel sensors, but includes only a single n-type blue surface pixel sensor B 38 (referred to by reference numerals 38a and 38b), that occupies no more than about the same area as two of the four blue pixel sensor segments as most easily seen in FIG. 3B and FIG. 3C. If the pixel sensor area is thought of as including four quadrants in cartesian coordinate space (indicated in FIGS. 3B and 3C), a left FPPD blue pixel sensor can occupy quadrants II and III, a right FPPD blue pixel sensor can occupy quadrants I and IV, a top FPPD blue pixel sensor can occupy quadrants I and II, and a bottom left FPPD blue pixel sensor can occupy quadrants III and IV.

In accordance with this aspect of the present invention, blue surface pixel sensors have smaller areas than regular pixels and are offset to the left, right, top, or bottom portion of the pixel sensor area. The left side of FIG. 3B shows a left FPPD pixel sensor and the right side of FIG. 3B shows a right FPPD pixel sensor. If FIG. 3A is interpreted as being a cross section in the vertical direction rather than the horizontal direction, then the left side of FIG. 3C shows a top FPPD pixel sensor and the right side of FIG. 3C shows a bottom FPPD pixel sensor. In cartesian coordinate space, a left FPPD blue pixel sensor occupies quadrants II and III, a right FPPD blue pixel sensor occupies quadrants I and IV, a top FPPD blue pixel sensor occupies quadrants I and II, and a bottom FPPD blue pixel sensor occupies quadrants III and IV.

Persons of ordinary skill in the art will understand that the result shown in FIGS. 3A through 3C can be achieved by performing a simple alteration of the blue pixel sensor implant mask in the mask set for fabricating the pixel sensor array to size and position the blue pixel sensor according to whether a left, right, top, or bottom FPPD pixel is to be formed.

Figure 3D:
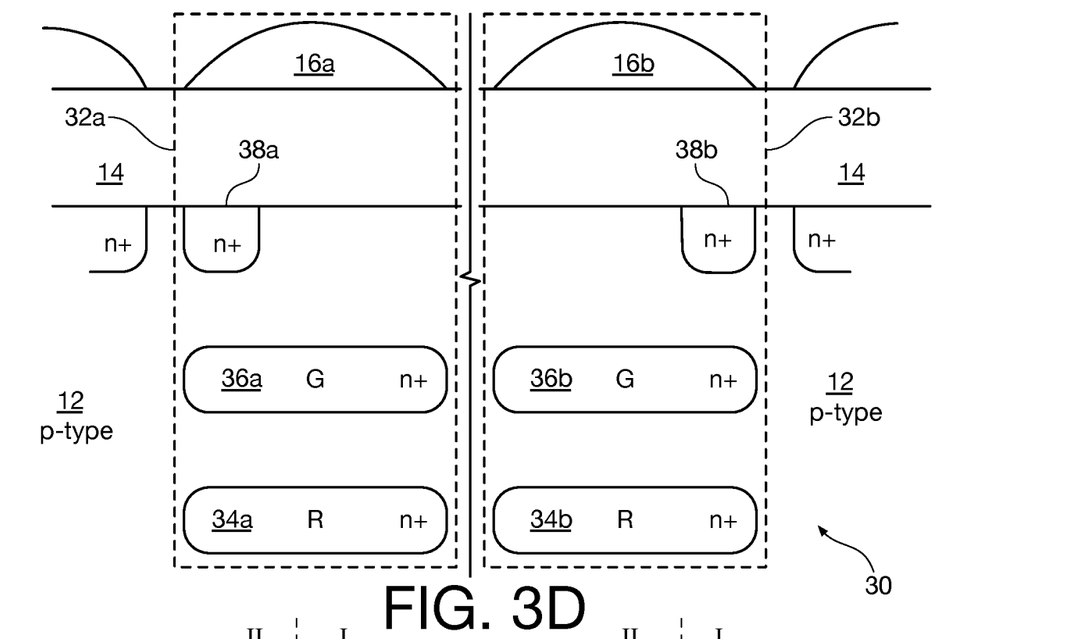
FIG. 3D is a cross sectional diagram of a portion of an imaging array depicting a solution for providing FPPD pixel sensors in an imaging array in accordance with one aspect of the present invention.
Figure 3E:
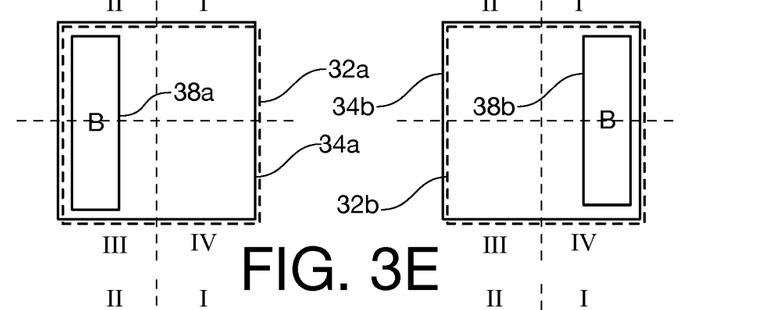
FIGS. 3E and 3F are top views of the portion of the imaging array depicted in FIG. 3D, showing several variations on the FPPD pixel structures.
Figure 3F:
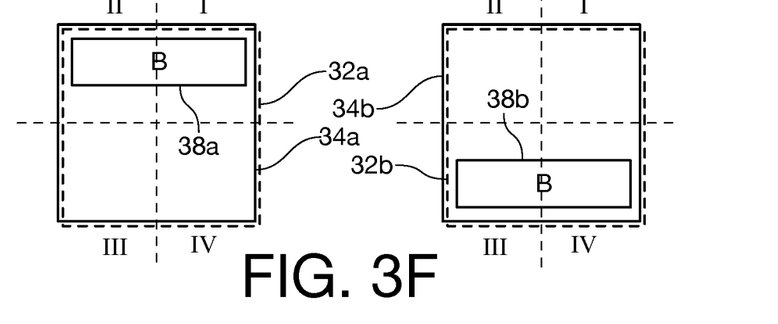

In accordance with a similar embodiment, shown in FIGS. 3D through 3F, the width of the blue sensor segments that are formed can also be narrowed in accordance with another aspect of the present invention. The amount that the width of the blue sensor can be narrowed will depend on the intensity of the phase difference effect that is desired subject to a limit dictated by minimum signal and signal-to-noise ratio requirements. FIG. 3D shows a cross-sectional view, FIG. 3E shows left and right FPPD pixel sensors, and FIG. 3F shows top and bottom FPPD pixel sensors.

Figure 4:
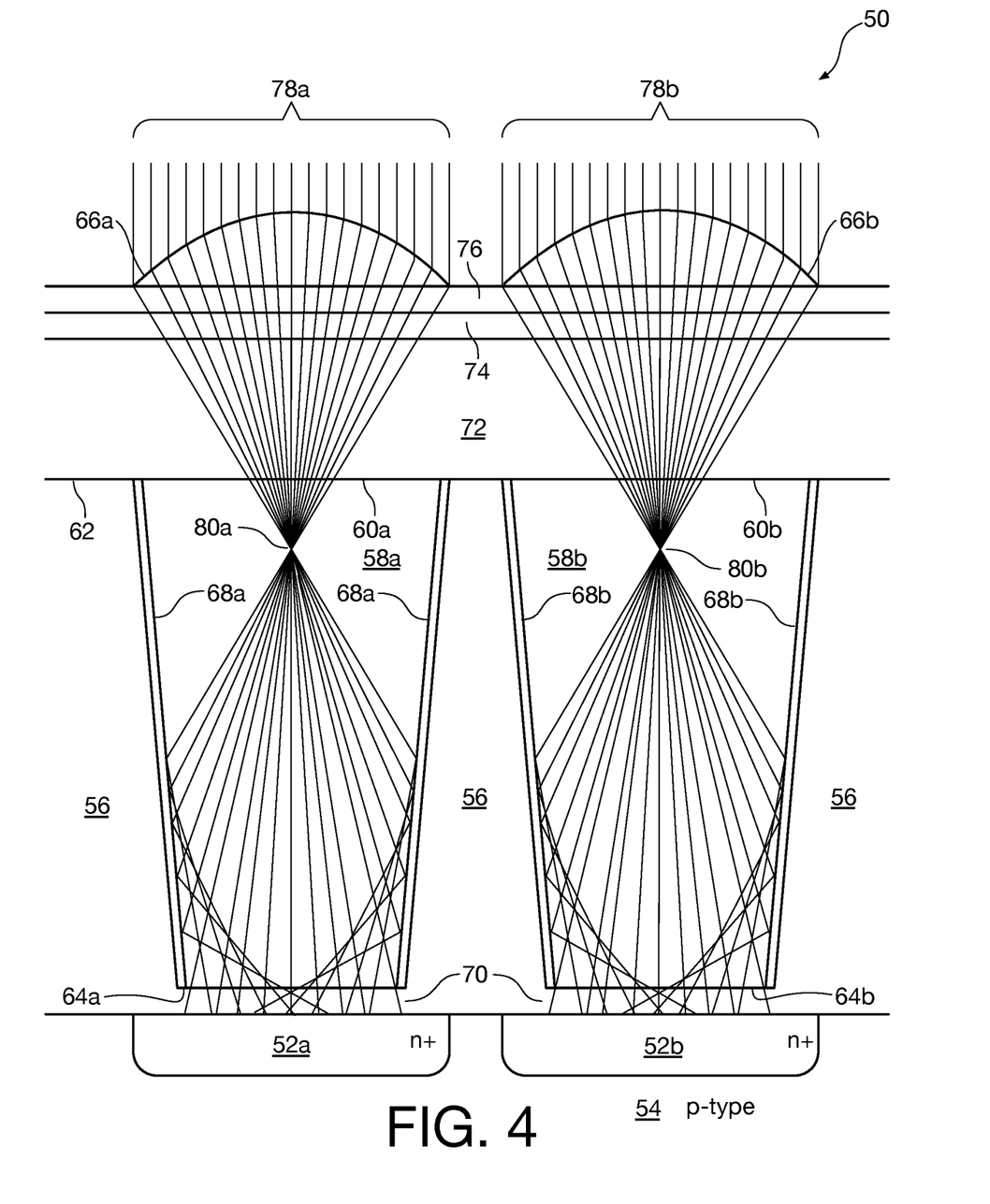
FIG. 4 is a cross sectional diagram of a portion of an imaging array depicting a solution to the problem of capturing light impinging on the array at increased angles in accordance with the present invention.

Referring now to FIG. 4, a cross-sectional diagram shows a portion 50 of an imaging array in accordance with one aspect of the present invention including a pair of surface pixel sensors 52a and 52b formed on a substrate 54. The substrate is shown in FIG. 4 as a p-type substrate and the surface pixel sensors 52a and 52b are n-type regions disposed in the p-type substrate forming the anodes of photodiodes as is known in the art, the substrate forming the cathodes of the photodiodes. Persons of ordinary skill in the art will appreciate that the p-type substrate may be a p-well formed in an underlying semiconductor substrate. Such skilled persons will also appreciate that while the portion of the array 50 depicted in FIG. 4 includes only two pixel sensors 52a and 52b, any array actually fabricated according to the principles of the present invention may include an arbitrary number of pixel sensors. Such skilled persons will also appreciate that surface pixel sensors 52a and 52b may be the blue pixel sensor components in vertical color pixel sensors such as X3® vertical color sensors fabricated by Foveon, Inc. Green and red sensors, not shown would be located further into the substrate 54 under the pixel sensors 52a and 52b.

A first interlayer dielectric layer 56 is formed over the surface of the substrate 54 and the n-type regions forming the surface pixel sensors 52a and 52b. Vias are formed to function as light pipes 58a and 58b. as presently preferred, the light pipes 58a and 58b are tapered, having a larger cross-sectional area at top ends 60a and 60b that are planar with the top surface 62 of the first interlayer dielectric layer 56 than at bottom ends 64a and 64b. The cross-sectional area of the bottom ends 64a and 64b of the light pipes 58a and 58b is smaller than the cross-sectional area of the pixel sensors 52a and 52b and are substantially centered over the pixel sensors 52a and 52b. The bottom ends 64a and 64b of the light pipes 58a and 58b are spaced apart from the top surface of the substrate. Microlenses 66a and 66b focus light into the pixel sensors 52a and 52b as is known in the art.

Although providing a vertical sidewall is conceptually simpler, it has several practical disadvantages. The most important disadvantage is that it limits the view angle at the top of the light pipe, which necessitates a larger pixel size and/or places very stringent restrictions on process control. In view of these disadvantages, a tapered design is preferred.

According to one aspect of the present invention, a process to form the tapered vias forming the light pipes 58a and 58b employs an etch chemistry that includes fluorine (F) to etch the $SiO_2$ and chemistry to create an organic polymer to deposit on the etched sidewall to protect it. The fluorine etches the bottom of the via while the polymer is deposited on its sidewalls to protect them from the etching process. At each interval of time $\Delta t$ the SiO2 is etched down a distance $\Delta y$ and a polymer having a thickness $\Delta x$ is deposited on the sidewall. By controlling the amount of F and polymer, the degree of taper is controlled. Since processes differ from foundry to foundry, routine testing may be employed to achieve the desired degree of taper in any given process.

A typical plasma etch chemistry that may include $CF_4$ which acts as the main source of F, $CHF_3$ which is the main source of hydrocarbon polymers $C_xH_y$ . . . $C_xH_yF_z$, and Ar which acts as a carrier gas and as a source of ions.

The light pipes 58a and 58b are leach lined with reflective lining layers shown at reference numerals 68a and 68b.

The light pipe in the present invention may be formed in one of two ways. According to one aspect of the present invention, where the first interlayer dielectric layer 56 is formed from silicon dioxide ($SiO_2$), the light pipe via may be filled with a filler material that is substantially transparent in the visible spectrum. Examples of suitable filler materials include dielectric materials like $SiO_2$, or a polymer having an index of refraction higher than the surrounding the first silicon dioxide interlayer dielectric layer 56.

To form a good reflective surface on the sidewall of the light pipes 58a and 58b, the reflective lining layer shown at reference numerals is deposited to line the inner wall of the light pipe must exhibit good reflection over the entire visible wavelength range, i.e., it is preferred that it have a silvery appearance. It is preferred that the reflective lining layer be a metal lining layer and has a smooth surface because rough surfaces are known to scatter light, and what is preferred is a surface having a high specular reflection. The thickness of the metal layer must be sufficient to prevent light from penetrating the sidewall to avoid cross-talk between pixel sensors at larger incident angles and also thick enough to avoid pinhole defects.

In accordance with one aspect of the present invention, an Al—Cu metallization material commonly used in CMOS processes as a metallization interconnect layer has the required properties. Tungsten metallization is also currently in use but has a dull gray appearance and an unacceptably large surface roughness which result in poor reflectivity.

At light wavelengths of 750 nm the theoretical minimum Al—Cu thickness for a light transmission attenuation of 10e6 is about 0.028 µm, however, this is likely to be insufficient because the resistivity of an Al—Cu thin film may be higher than the bulk resistivity and films having thicknesses in this range are known to have pinholes. It is a minimum thickness for Al—Cu films is at least about 0.14 µm. Further, because the step coverage of plasma vapor deposited (PVD) Al—Cu is relatively poor, a sputter thickness of about 0.24 µm at the top ends 60a and 60b is presently preferred, which results in a minimum thickness of about 0.14 µm at the bottom ends 64a and 64b of the light pipes 58a and 58b.

In one exemplary non-limiting embodiment, the top ends 60a and 60b of the light pipes are chosen to provide a minimum photoresist width between adjacent light pipe openings of 0.8 µm). In an exemplary embodiment where a pixel sensor size of 4.15 µm is assumed, this gives a top dimension of 4.15-0.8=3.35 µm.

In a tapered light pipe design the bottom of the light pipe has to be smaller than the dimensions of the top surface of the photodiode, which, in a non-limiting example, assumed to be about 2.8 µm active. As an example, if active enclosure of the light pipe is taken as 0.2 µm, the bottom width can be determined=2.8-0.4=2.4 µm.

The length of the light pipe is not critical for the optics design, providing considerable freedom to choose it. It is advantageous to have a thicker back-end-of-line (BEOL) for additional metal layers. In one exemplary embodiment, the thickness of the interlayer dielectric layer 56 is chosen to be about 6 µm, which allows the inclusion of four metal interconnect layers within the interlayer dielectric layer 56.

Given the above parameters, the sidewall angle will be, nominally, about 3.6°. Persons of ordinary skill in the art will appreciate that a thicker first interlayer dielectric layer 56 will reduce the angle further; however, increasing the thickness of the first interlayer dielectric layer 56 from 6 µm to 7 µm only reduces the sidewall angle by 0.5°, which does not provide much of an advantage, and increases the aspect ratio of the via forming the light pipes 58a and 58b.

A base layer 70 is interposed to separate the bottoms of the light pipes 58a and 58b from the surfaces of the pixel sensors 52a and 52b. It would be optically advantageous if the light pipe extended all the way down to the silicon surface. However, this would cause damage in the silicon, result in excess dark current, and may even etch into the silicon. In addition, if the metal material from which the reflective liner is made comes into contact with the upper surface of the pixel sensor, the thermal budget of subsequent process steps will cause metal ions to diffuse into and severely damage the pixel sensor layer, rendering the pixel sensors 52a and 52b inoperative. The base layer is composed of residual $SiO_2$ from the first interlayer dielectric layer that is left unetched below the bottom ends 64a and 64b of the light pipes 58a and 58b, respectively.

If the thickness of the base layer 70 is too large, light will be permitted to escape under the metal and fall outside the active areas of the pixel sensors 52a and 52b, especially at larger angles, decreasing the efficiency of the light capture.

In one exemplary embodiment. at an incident angle of 40°, the light entering the light pipe has a maximum angle of 55°. The thickness of the base layer is chosen to allow no more than 1% of light falling outside the active pixel sensor area, allowing for 0.1 µm of mis-alignment between the active pixel sensor area and the light pipe. Simulations have shown that with zero misalignment between the active pixel sensor area and the light pipe, no light falls outside of the active pixel sensor area and with a misalignment of 0.1 µm 0.6% of the light falls outside of the active pixel sensor area. Based on simulation results, a thickness of about 0.1 µm for the base layer 70 has been found to be satisfactory. If a thickness of about 0.2 µm is used for the base layer 70, simulation results have shown that with zero misalignment between the active pixel sensor area and the light pipe, 6.4% of the light falls outside of the active pixel sensor area and with a misalignment of 0.1 µm 11.7% of the light falls outside of the active pixel sensor area.

A second interlayer dielectric layer 72 is disposed over the top of first interlayer dielectric layer 56 and the planarized tops of the reflective lining layers 68a and 68b as and the top of the filler material in each of the light pipes 58a and 58b. In one exemplary embodiment, this second interlayer dielectric layer 72 may have a thickness of about 2.5 µm and at that thickness can support two layers of metal interconnect.

A passivation layer 74 is formed over the top surface of the second interlayer dielectric layer 72 and a planarization layer 76 is formed over the top surface of the passivation layer 74. In one exemplary embodiment, the thickness of the passivation layer 74 may be about 0.3 µm and the thickness of the planarization layer 76 may be about 0.4 µm. These layers may be formed from, for example, deposited silicon dioxide.

FIG. 4 shows a plurality of light rays 78a and 78b entering pixel sensors 52a and 52b through microlenses 66a and 66b respectively. The focal lengths of microlenses 66a and 66b are chosen to position the focal points of the light rays at positions 80a and 80b respectively. Persons of ordinary skill in the art will note that the positions of focal points 80a and 80b are located within the lightpipes 58a and 58b. Accordingly and as may be seen in FIG. 4, all incoming light rays 78a and 78b diverging past the focal points 80a and 80b strike the pixel sensors 52a and 52b, either directly or after reflection from the reflective lining layers 68a and 68b.

Figure 5A:
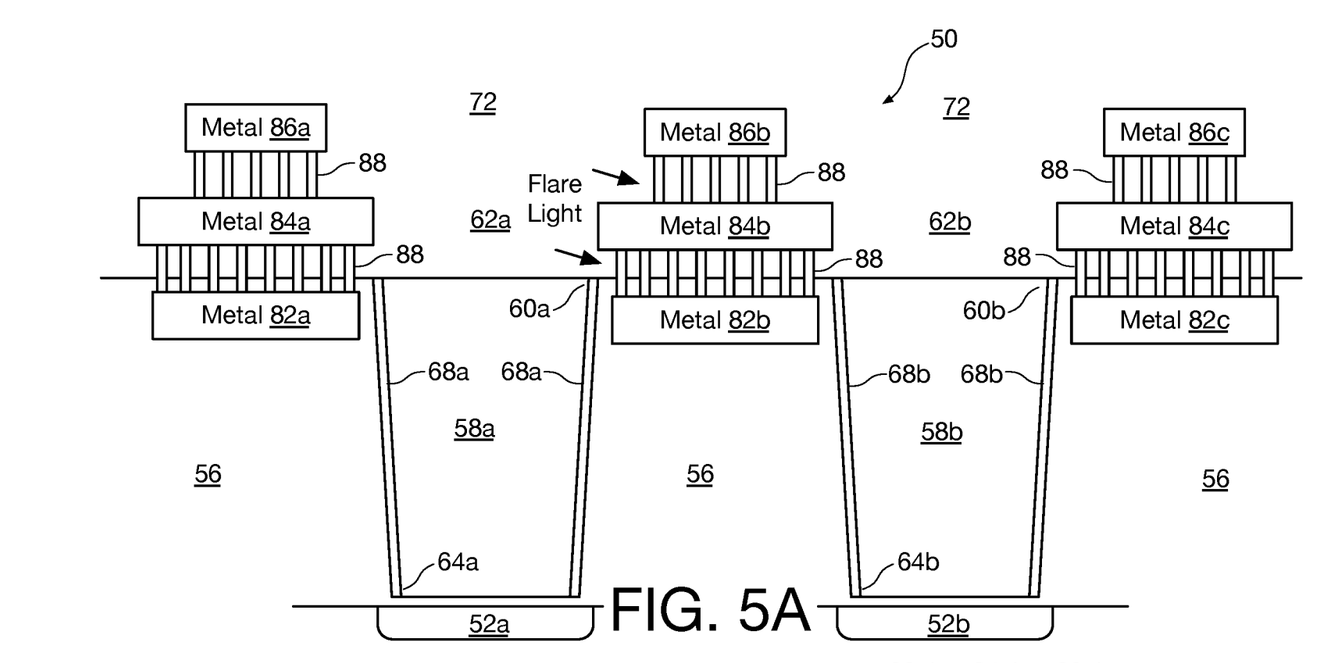
FIG. 5A is a cross sectional diagram of a portion of an imaging array depicting a solution to the problem of capturing light impinging on the array at increased angles and illustrating structures for eliminating the effects of flare light in pixel sensors in accordance with an aspect of the present invention.
Figure 5B:
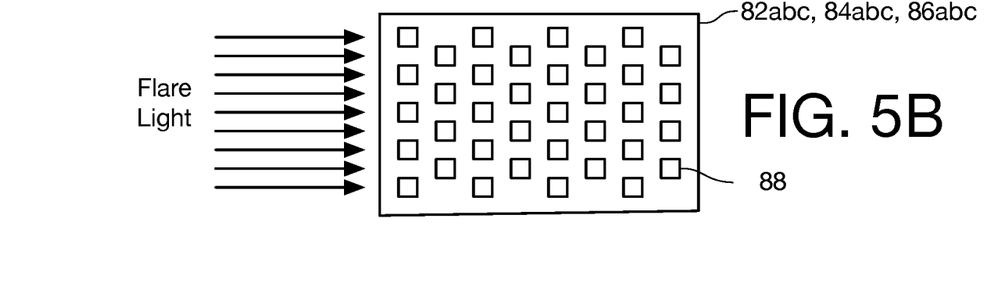
FIG. 5B is a diagram showing a top view of one of the structures included in FIG. 5A for eliminating the effects of flare light in pixel sensor in accordance with an embodiment of the present invention.

Referring now to FIG. 5A and FIG. 5B, two diagrams illustrate structures for eliminating the effects of flare light in pixel sensor arrays such as the array portion 50 of FIG. 4 in accordance with an embodiment of the present invention. FIG. 5A is a cross-sectional view of an adjacent pair of lightpipe structures 58a and 58b such as those of FIG. 4.

Flare in the lens and camera can result in incident angles for incoming light in the range of from about 70° to about 75°. In conventional optical designs, it is not possible to protect the pixel sensor against flare light, but in accordance with an aspect of the present invention there are some measures that can be taken to suppress flare light. The effect of flare light has to be considered both at the top ends 60a and 60b and at the bottom ends 64a and 64b of the light pipes 58a and 58b. As noted above, at the bottom ends 64a and 64b of the light pipes 58a and 58b, flare can be minimized by using a thin base layer, i.e., a thickness of about 0.1 µm for a lightpipe having the dimensions recited herein in the exemplary embodiment discussed above. Up to 15% of flare light can fall outside the active pixel sensor area but should not be a problem since the amount of flare light captured in any single pixel sensor 52a or 52b is a small fraction of total light.

As shown in FIG. 5A, metal interconnect layer segments 82a, 84a, and 86a form a vertical structure to the left side of lightpipe 58a. Metal interconnect layer segment 82a is formed in the first interlayer dielectric layer 56 and metal interconnect layer segments 84a and 86a are formed in the second interlayer dielectric layer 72. Similarly, metal interconnect layer segments 82b, 84b, and 86b form a vertical structure between lightpipes 58a and 58b. Metal interconnect layer segment 82b is formed in the first interlayer dielectric layer 56 and metal interconnect layer segments 84b and 86b are formed in the second interlayer dielectric layer 72. Metal interconnect layer segments 82c, 84c, and 86c form a vertical structure to the right side of lightpipe 58b. Metal interconnect layer segment 82c is formed in the first interlayer dielectric layer 56 and metal interconnect layer segments 84c and 86c are formed in the second interlayer dielectric layer 72.

The openings between metal segments 84a, 84b, and 84c define the light-admitting areas for pixel sensors 52a and 52b. In the embodiment shown in FIG. 5A, the light admitting area is large enough to admit light over the entire surface of each of pixel sensors 52a and 52b. Pixel sensors that are configured to admit light over their entire surfaces may be referred to herein as regular pixel sensors.

Metal interconnect layer segments 82a, 84a, and 86a are all connected together using a plurality of interconnect vias, one of which is shown at reference numeral 88. Metal interconnect layer segments 82b, 84b, and 86b and metal interconnect layer segments 82c, 84c, and 86c are also connected together using a plurality of interconnect vias, one of which is indicated at reference numeral 88.

FIG. 5B shows a top view of an illustrative one of the vertical structures showing the layout of the interconnect vias 88 (using one of metal interconnect segments 82abc, 84abc, or 86abc as an illustrative example). The vias 88 are laterally positioned so that flare light indicated by arrows as entering from the left side of FIG. 5B is effectively blocked from passing between any of the metal interconnect layer segments that make up any of the vertical structures. A path for flare light that is blocked from entering lightpipe 58b from the region above lightpipe 58a is also shown by arrows in FIG. 5A. These multiple sheets of metal are preferably all tied to Vpix, to suppress noise.

Figure 6:
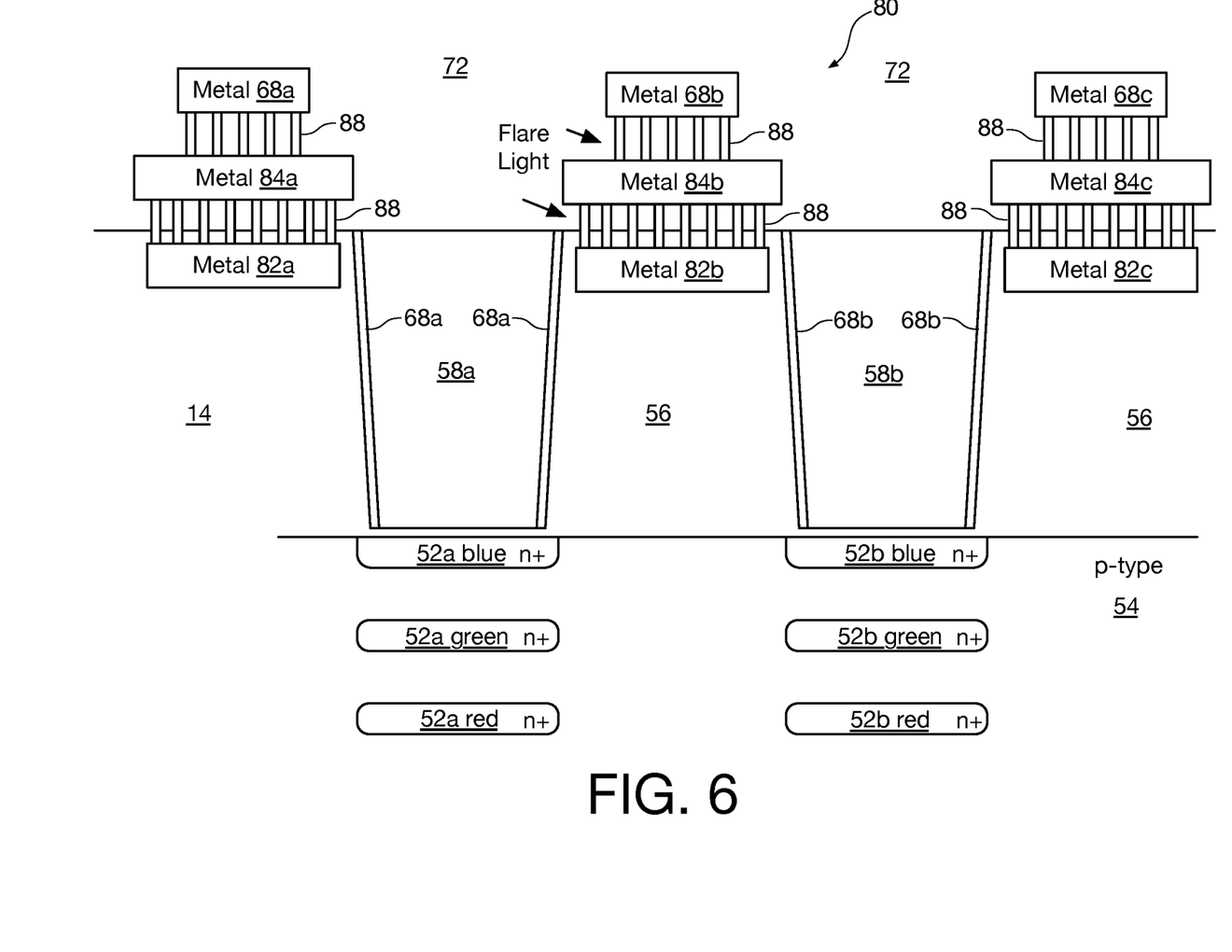
FIG. 6 is a cross-sectional view of a portion of an imaging array like that of FIG. 5A incorporating vertical color pixel sensors.

Referring now to FIG. 6, a cross-sectional view is presented of a portion of a pixel sensor array 80 employing vertical color pixel sensors that are configured as regular pixel sensors like the pixel sensors 52a and 52b in FIG. 5A. The only difference between the portion of the pixel sensor array 50 of FIG. 5A. and the portion of the pixel sensor array 80 is that the pixel sensors include surface blue pixel sensors 52a_blue and 52b_blue, and buried green and red pixel sensors 52a_green and 52b_green and 52a_red and 52b_red, respectively. As in the embodiment shown in FIGS. FIG. 3A, FIG. 3B and FIG. 3C, persons of ordinary skill in the art will appreciate that each vertical color pixel sensor the particular embodiment shown in FIG. 6 includes two sub-surface (buried) pixel sensors, buried green and red pixel sensors 52a_green and 52b_green and 52a_red and 52b_red, but other embodiments of the invention are contemplated having vertical color pixel sensors that include a single buried pixel sensor or more than two buried pixel sensors.

Figure 7:
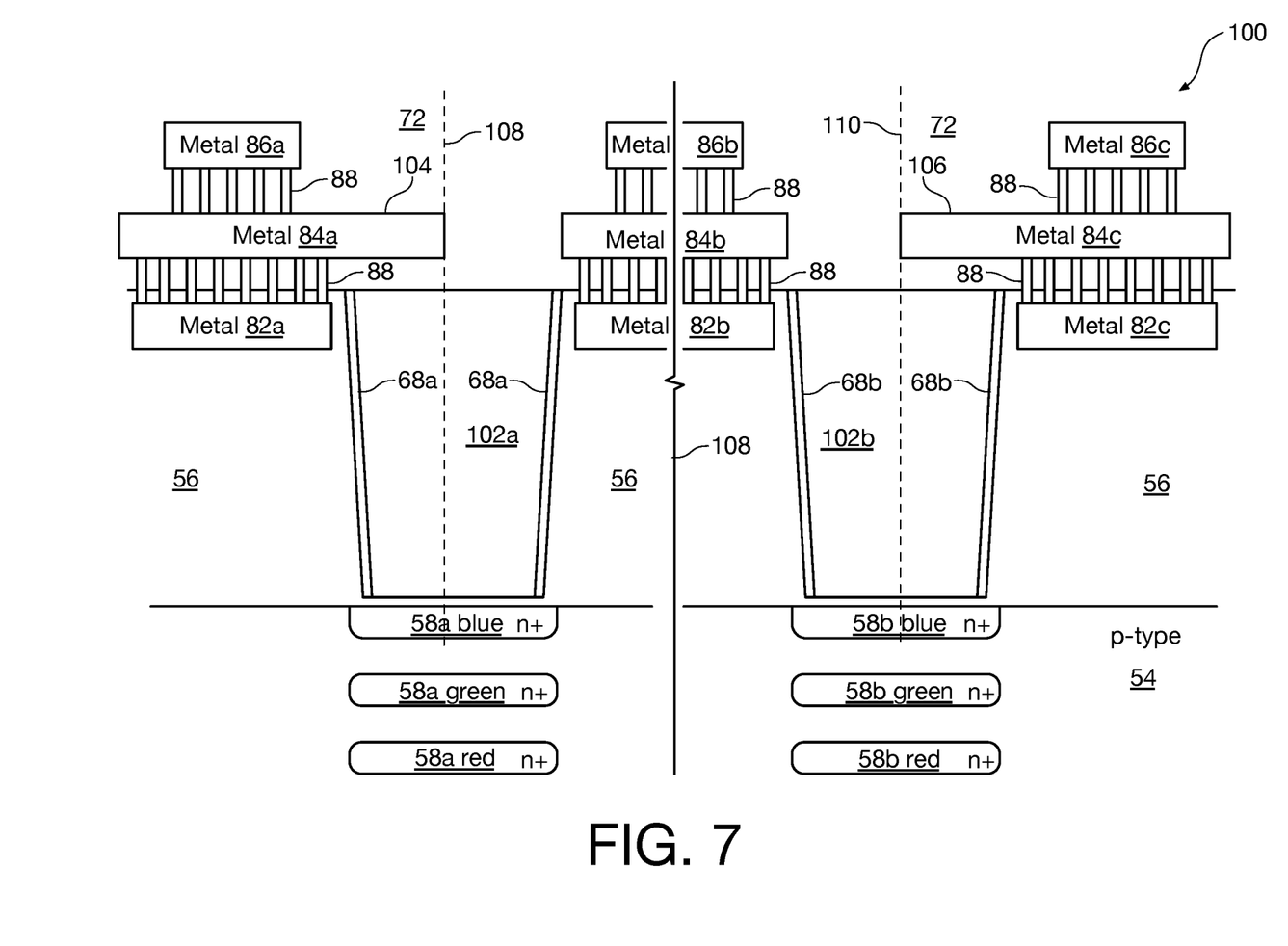
FIG. 7 is a cross-sectional view of a portion of an imaging array like that of FIG. 6 incorporating FPPD pixel sensors in vertical color pixel sensors.

Referring now to FIG. 7, a cross-sectional view of a portion 100 of a pixel sensor array including a pair of pixel sensors formed under lightpipes 102a and 102b, respectively. Instead of being regular pixel sensors, the pixel sensors depicted in FIG. 7 are FPPD pixel sensors. The array portion 100 is in most respects similar to the array portion 50 of FIG. 5A, FIG. 5B, and the array portion 80 of FIG. 6. Accordingly, the same reference numerals that were used in FIG. 5A, FIG. 5B, and FIG. 6 will be used to identify the elements of the portion 100 in FIG. 7. The two differences between the pixel sensors in FIG. 5A, FIG. 5B, and FIG. 6 and the pixel sensors 102a and 102b of FIG. 7 is that the metal segment 84a includes a portion 104 extending to the right above the left-hand portion of the lightpipe 102a to mask the left side of the blue pixel sensor 58a as shown by dashed vertical axis 108 to form a right FPPD pixel sensor. Similarly, the metal segment 84c includes a portion 106 extending to the left above the right-hand portion of the lightpipe 102b to mask the right side of the blue pixel sensor 58b as shown by dashed vertical axis 110 to form a left FPPD pixel sensor. Persons of ordinary skill in the art will appreciate that the pixel sensors depicted in FIG. 7 would not be placed adjacent to one another in an array as indicated by separation line 108. Such skilled persons will also appreciate that if the cross section of FIG. 7 is interpreted to be vertically oriented rather than horizontally oriented, pixel sensors 102a and 102b represent top and bottom FPPD pixel sensors.

Figure 8:
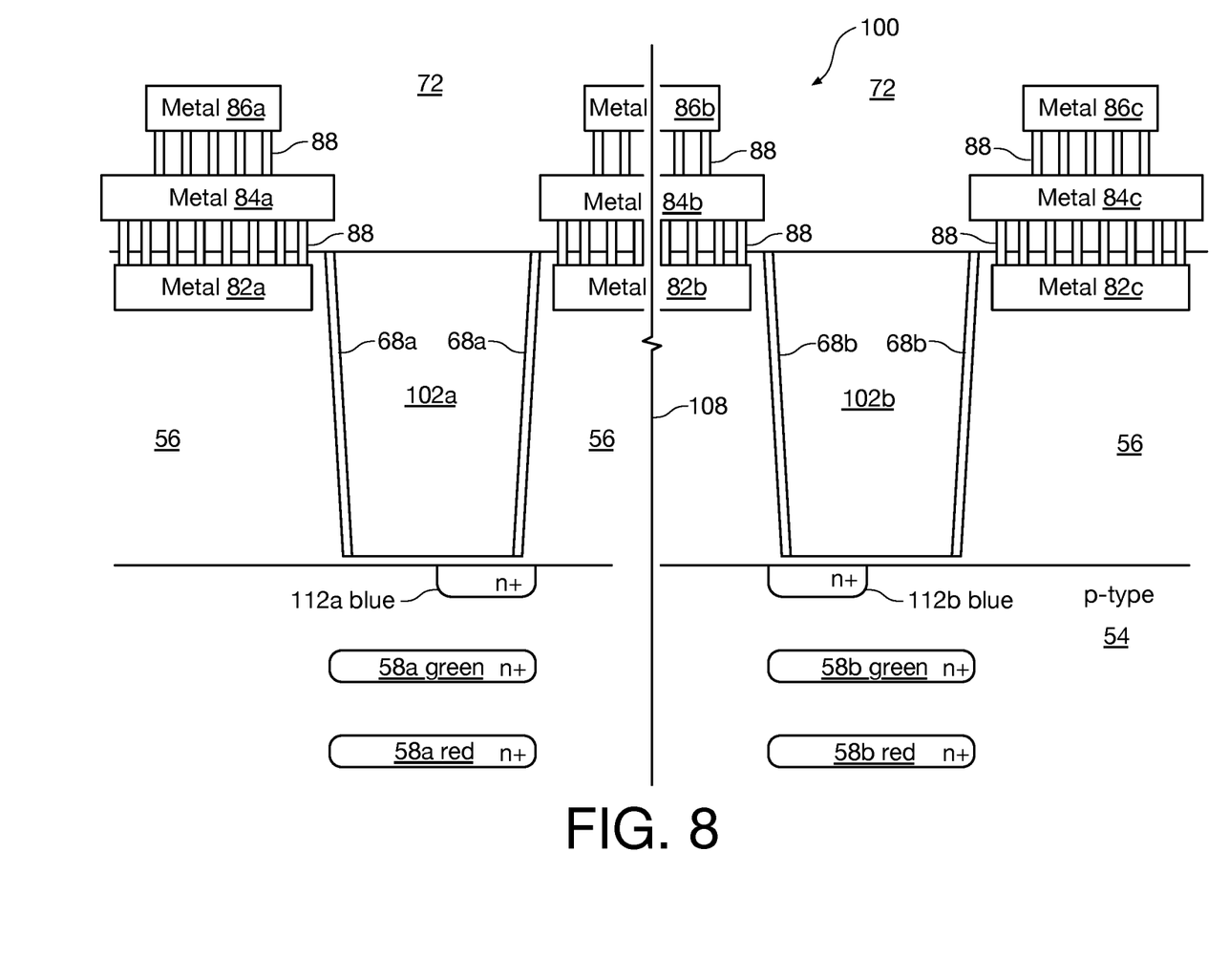
FIG. 8 is a cross-sectional view of a portion of an imaging array like that of FIG. 7 incorporating FPPD pixel sensors in vertical color pixel sensors.

According to another aspect of the invention, the FPPD techniques of FIGS. 3A through 3E may be applied to the lightpipe pixel sensors of FIG. 6. An illustrative embodiment of a pair of lightpipe FPPD pixels is shown with reference to FIG. 8. In the illustrative embodiment of FIG. 8 the apertures defined by the metal line segments 84a, 84b, and 84c are fully opened. The FPPD pixels are created by reducing the blue surface pixel 112a_blue in width and shifting it to the right to form a left FPPD surface pixel sensor and by reducing the blue surface pixel 112b_blue in width and shifting it to the left to form a right FPPD surface pixel sensor. If the cross section of FIG. 8 is viewed as vertically oriented rather than horizontally oriented, the FPPD pixel sensors 112a and 112b become top and bottom FPPD pixel sensors.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A focal plane phase detect pixel sensor formed on a substrate and comprising:
    a surface pixel sensor formed in the substrate;
    a layer of dielectric material formed over the surface of the substrate;
    an aperture formed in the dielectric layer and aligned with the surface pixel sensor, the aperture having an inner side wall;
    a reflective lining layer formed on the inner side wall of the aperture and spaced apart from the surface of the substrate, the reflective lining layer being substantially fully reflective to visible light, an inner wall of the reflective lining layer having a smaller cross-sectional area than a cross-sectional area of the surface pixel sensor, a top edge of the inner lining wall of the reflective lining layer lying in a plane with a top surface of the layer of dielectric material;
    a filler material disposed in the aperture inside of the reflective lining layer and having a top surface lying in the plane with the top surface of the layer of dielectric material, the filler material being substantially transparent to visible light;
    a metal layer disposed over the surface pixel sensor;
    a void formed in the metal layer and positioned over the surface pixel sensor to expose no more than two adjacent quadrants centered in the cross-sectional area of the surface pixel sensor over which it is positioned; and
    a microlens disposed over the void in the metal layer.

2. The focal plane phase detect pixel sensor of claim 1 wherein:
    the substrate is a layer of silicon doped with a dopant species having a first conductivity type; and
    the surface pixel sensor comprises a photodiode formed at the surface of the substrate, the photodiode having an anode formed from a region of silicon doped with a dopant species having a second conductivity type opposite the first conductivity type.

3. The focal plane phase detect pixel sensor of claim 1 further comprising:
at least one subsurface pixel sensor disposed in the substrate below, in alignment with, and insulated from the surface pixel sensor.

4. The focal plane phase detect pixel sensor of claim 3, wherein the at least one subsurface pixel sensor comprises:
a first subsurface pixel sensor disposed in the substrate below, in alignment with, and insulated from the surface pixel sensor; and
a second subsurface pixel sensor disposed in the substrate below, in alignment with, and insulated from the first subsurface pixel sensor.

5. The focal plane phase detect pixel sensor of claim 1 wherein the reflective lining layer is formed from an Al—Cu metal layer.

6. The focal plane phase detect pixel sensor of claim 1 wherein the filler material is formed from a polymer.

7. The focal plane phase detect pixel sensor of claim 1 wherein the filler material is formed from a dielectric material.

8. The focal plane phase detect pixel sensor of claim 1 wherein the dielectric material is silicon dioxide.

9. The focal plane phase detect pixel sensor of claim 1 wherein the inner wall of the reflective lining layer is tapered from a larger cross-sectional area at the top surface thereof to a smaller cross-sectional area at a bottom surface thereof.

10. The focal plane phase detect pixel sensor of claim 1 wherein the aperture is aligned with the surface pixel sensor within a predetermined tolerance.

11. The focal plane phase detect pixel sensor of claim 1 wherein the inner wall of the reflective lining layer is spaced apart from the surface of the substrate by a distance selected to allow not more than 1% of light to fall outside the surface pixel sensor area.

12. The focal plane phase detect pixel sensor of claim 1, further comprising:
a vertical structure disposed at outer edges of the void and forming an entrance aperture for light to pass into the surface pixel sensor, the vertical structure including
segments of a first metal interconnect layer positioned below a top surface of reflective lining layers of adjacent surface pixel sensors;
segments of a second metal interconnect layer positioned above a top surface of the reflective lining layers of adjacent pixel sensors;
segments of a third metal interconnect layer positioned above the segments of the second metal interconnect layer;
a plurality of first metal interconnect vias disposed between segments of the first metal interconnect layer and the second metal interconnect layer;
a plurality of second metal interconnect vias disposed between segments of the second metal interconnect layer and the third metal interconnect layer;
the plurality of first and second metal interconnect vias laterally positioned with respect to one another to block flare light from passing through any of the vertical structures.

13. The focal plane phase detect pixel sensor of claim 12 wherein the plurality of first and second metal interconnect vias are arranged in rows, metal interconnect vias in adjacent rows being offset from one another.

14. A focal plane phase detect pixel sensor formed on a substrate and comprising:

a surface pixel sensor formed in a pixel sensor area at a surface of the substrate, the surface pixel sensor having a sensing area occupying no more than an adjacent pair of quadrants centered in the pixel sensor area; and
a microlens disposed over the surface pixel sensor.

15. The focal plane phase detect pixel sensor of claim 14 wherein the sensing area has a width less than the width of the adjacent pair of quadrants in the pixel sensor area.

16. The focal plane phase detect pixel sensor of claim 14 wherein the sensing area occupies no more than a top adjacent pair of quadrants in the pixel sensor area.

17. The focal plane phase detect pixel sensor of claim 14 wherein the sensing area occupies no more than a bottom adjacent pair of quadrants in the pixel sensor area.

18. The focal plane phase detect pixel sensor of claim 14 wherein the sensing area occupies no more than a left-side adjacent pair of quadrants in the pixel sensor area.

19. The focal plane phase detect pixel sensor of claim 14 wherein the sensing area occupies no more than a right-side adjacent pair of quadrants in the pixel sensor area.

20. A pixel sensor array formed on a substrate, the pixel sensor array comprising:
a plurality of surface pixel sensors formed at a surface of the substrate, a first group of the surface pixel sensors being regular surface pixel sensors and a second group of the surface pixel sensors being focal plane phase detecting surface pixel sensors;
a layer of dielectric material formed over the surface of the substrate;
a plurality of apertures formed in the dielectric layer, each aperture aligned with one of the surface pixel sensors, each aperture having an inner side wall;
a reflective lining layer formed on the inner side wall of each aperture and spaced apart from the surface of the substrate, the reflective lining layer being substantially fully reflective to visible light, an inner wall of each reflective lining layer spaced apart from the surface of the substrate and having a smaller cross-sectional area than a cross-sectional area of each surface pixel sensor in both the first and second groups, a top edge of the inner lining wall of each reflective lining layer lying in a plane with a top surface of the layer of dielectric material;
a filler material disposed in each aperture inside of the reflective lining layer and having a top surface lying in the plane with the top surface of the layer of dielectric material, the filler material being substantially transparent to visible light;
a metal layer disposed over the plurality of surface pixel sensors;
a first-sized void formed in the metal layer positioned over each regular surface pixel sensor, each first-sized void sized to expose the entire cross-sectional area of the regular surface pixel sensor over which it is positioned;
a second-sized void formed in the metal layer positioned over each focal plane phase detecting surface pixel sensor, each second-sized void positioned to expose one of a right portion, a left portion, a top portion and a bottom portion of the cross-sectional area of the focal plane phase detecting surface pixel sensor over which it is positioned; and
a microlens disposed over each first-sized and second-sized void in the metal layer.

21. The pixel sensor array of claim 20 wherein:
the substrate is a layer of silicon doped with a dopant species having a first conductivity type; and each regular surface pixel sensor and each focal plane phase detecting surface pixel sensor comprises a photodiode formed at the surface of the substrate, each photodiode having an anode formed from a region of silicon doped with a dopant species having a second conductivity type opposite the first conductivity type.

22. The pixel sensor array of claim 20 further comprising:
at least one subsurface pixel sensor disposed in the substrate below, in alignment with, and insulated from each regular surface pixel sensor and each focal plane phase detecting surface pixel sensor.

23. The pixel sensor array of claim 22, wherein the at least one subsurface pixel sensor comprises:
a first subsurface pixel sensor disposed in the substrate below, in alignment with, and insulated from the surface pixel sensor; and
a second subsurface pixel sensor disposed in the substrate below, in alignment with, and insulated from the first subsurface pixel sensor.

24. The pixel sensor array of claim 20 wherein the reflective lining layer is formed from an Al—Cu metal layer.

25. The pixel sensor array of claim 20 wherein the filler material is formed from a polymer.

26. The pixel sensor array of claim 20 wherein the filler material is formed from a dielectric material.

27. The pixel sensor array of claim 20 wherein the dielectric material is silicon dioxide.

28. The pixel sensor array of claim 20 wherein the inner wall of each reflective lining layer is tapered from a larger cross-sectional area at the top surface thereof to a smaller cross-sectional area at a bottom surface thereof.

29. The pixel sensor array of claim 20 wherein each aperture is aligned with one of the surface pixel sensors within a predetermined tolerance.

30. The pixel sensor array of claim 20 wherein the inner wall of each reflective lining layer spaced apart from the surface of the substrate by a distance selected to allow not more than 1% of light to fall outside the surface pixel sensor area.

31. The pixel sensor array of claim 20, further comprising:
a vertical structure disposed between each adjacent pair of the surface pixel sensors and forming entrance apertures for light to pass into the surface pixel sensors, each vertical structure including
segments of a first metal interconnect layer positioned below a top surface of the reflective lining layers of the adjacent ones of the surface pixel sensors;
segments of a second metal interconnect layer positioned above a top surface of the reflective lining layers of the adjacent ones of the surface pixel sensors;
segments of a third metal interconnect layer positioned above the segments of the second metal interconnect layer;
a plurality of first metal interconnect vias disposed between segments of the first metal interconnect layer and the second metal interconnect layer;
a plurality of second metal interconnect vias disposed between segments of the second metal interconnect layer and the third metal interconnect layer;
the plurality of first and second metal interconnect vias laterally positioned with respect to one another to block flare light from passing through any of the vertical structures.

32. The pixel sensor array of claim 31 wherein the plurality of first and second metal interconnect vias are arranged in rows, metal interconnect vias in adjacent rows being offset from one another.

33. A pixel sensor array formed on a substrate, the pixel sensor array comprising:
a plurality of surface pixel sensors formed at a surface of the substrate, each surface pixel sensor occupying a pixel sensor area and having a sensing area within the pixel sensor area,
a first group of the surface pixel sensors being regular surface pixel sensors, each regular surface pixel sensor having a sensor area coextensive with its pixel sensor area;
a second group of the surface pixel sensors being focal plane phase detecting surface pixel sensors, each focal plane phase detecting surface pixel sensor having a sensor area that occupies no more than two adjacent quadrants centered in the cross-sectional area of its pixel sensor area; and
a microlens disposed over each surface pixel sensor.

34. The pixel sensor array of claim 33 wherein the sensing area of each focal plane phase detect pixel sensor has a width less than the width of the adjacent pair of quadrants in its pixel sensor area.

35. The pixel sensor array of claim 33 wherein the sensing area of at least one focal plane phase detect pixel sensor occupies no more than a top adjacent pair of quadrants in its pixel sensor area.

36. The pixel sensor array of claim 33 wherein the sensing area of at least one focal plane phase detect pixel sensor occupies no more than a bottom adjacent pair of quadrants in its pixel sensor area.

37. The pixel sensor array of claim 33 wherein the sensing area of at least one focal plane phase detect pixel sensor occupies no more than a left-side adjacent pair of quadrants in its pixel sensor area.

38. The pixel sensor array of claim 33 wherein the sensing area of at least one focal plane phase detect pixel sensor occupies no more than a right-side adjacent pair of quadrants in its pixel sensor area.

* * * * *